TEMPERATURE STABLE TRANSISTOR AMPLIFIER

Filed May 26, 1959

INVENTOR.
SAMUEL RALPH PARRIS

BY
Francis A. Varallo
AGENT 2,963,656
Patented Dec. 6, 1960

2,963,656

TEMPERATURE STABLE TRANSISTOR AMPLIFIER

Samuel Ralph Parris, Ridley Park, Pa., assignor to Burroughs Corporation, Detroit, Mich., a corporation of Michigan Filed May 26, 1959, Ser. No. 815,976

8 Claims. (Cl. 330—17)

This invention relates generally to semi-conductor amplifiers, and more particularly to a temperature compensated amplifier circuit employing direct-coupled transistors.

Transistors are subject to changes in their electrical characteristics as a result of variations in the ambient operating temperature. For example, the voltage drop between the base and emitter elements of a transistor, designated V*be*, decreases with a rise in temperature—the change in the base-to-emitter junction voltage necessary to sustain a given emitter current being a nearly linear function of temperature. The collector cutoff current, I*co*, which is the leakage current from collector-to-base when no emitter current is applied, increases exponentially with a rise in temperature. Further, the D.-C. current gain, or beta (B), of the transistor may increase with a rise in temperature. Other transistor characteristics vary with temperature changes but the aforementioned shifts in parameters are the most serious problem in the design of a temperature stable direct-coupled transistor amplifier.

In accordance with the present invention, a transistor buffer amplifier is provided wherein the over-all thermal drift of the circuit is negligible over the design temperature range. The buffer amplifier comprises two cascaded stages, incorporating a silicon junction transistor in the input stage, and a germanium junction transistor in the output stage. The transistors are of opposite types of conductivity and are connected as direct-coupled emitter followers in a complementary symmetry configuration. Variable impedance means are provided for adjusting the effective output impedance of the silicon stage. The voltage drop across this effective impedance is a function of the collector cutoff current of the germanium stage which is caused to flow therethrough. The present amplifier utilizes the latter voltage drop to compensate for the thermal drift which remains in the amplifier after the drift cancellation provided by the complementary symmetry arrangement of the transistors. The instant circuit configuration has particular application as an impedance transformer and is adapted to amplify small input signals from a source having a relatively high impedance and to supply the amplified signals to a utilization circuit from a low impedance source. Circuit means are provided for eliminating any voltage offset which would otherwise exist as a component of the amplified signals due to the different electrical characteristics of the amplifier stages.

It is therefore a general object of the present invention to provide an improved buffer amplifier circuit having a low thermal drift.

Another object of the invention is to provide a temperature-stable buffer amplifier utilizing only solid state electronic components.

A further object of the invention is to provide a direct-coupled transistor amplifier capable of receiving input signals from a relatively high impedance source and delivering signals having substantially the same amplitude from a low impedance source.

A still further object of the invention is to provide a temperature-stable direct-coupled amplifier circuit comprising a silicon transistor input stage and a germanium transistor output stage connected in complementary symmetry fashion and in which the characteristics of the silicon transistor may be easily adjusted to compensate more completely for the residual thermal drift of the amplifier.

A more specific object is to provide a buffer amplifier circuit having all of the aforementioned features and advantages in combination.

These and other features of the invention will hereinafter become more fully apparent from the following description when read in connection with the accompanying drawings, wherein.

Figure 3:
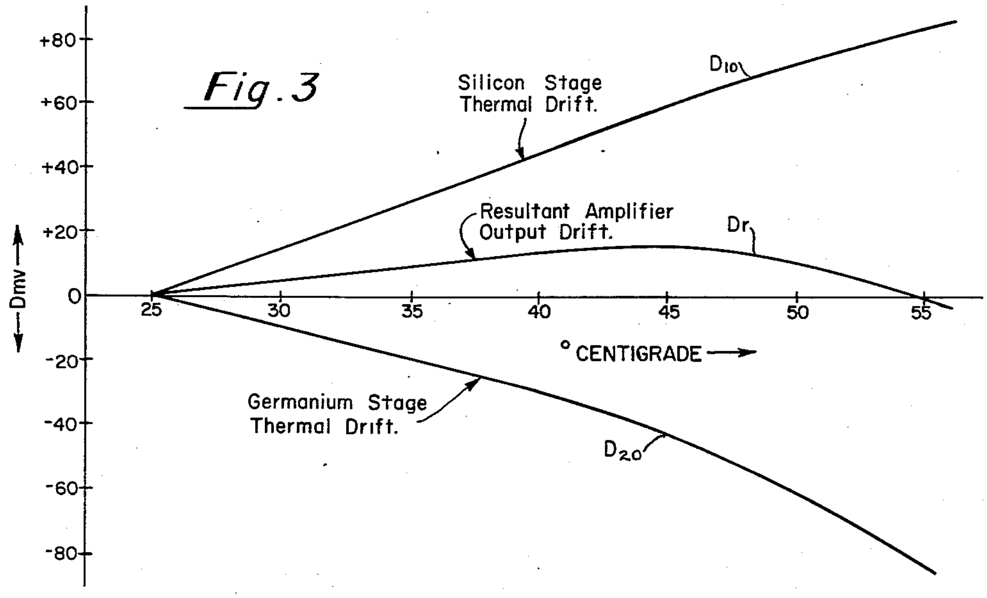
Fig. 3 is a graph of the approximate thermal drifts expected respectively from the amplifier stages for the design temperature range, and the resultant thermal drift resulting from the combination of the two stages in the manner suggested in the instant invention.

An analysis of the amplifier circuit will be made with reference of Figs. 1 and 2. In each of the latter figures like reference numerals have been employed to designate similar components. Conventional graphical symbols have been used for the emitter, collector and base electrodes of each of the transistors. The positive and negative supply voltages for the transistors listed respectively in order of increasing absolute magnitude are $V_1$, and $-V_1$, $-V_2$.

Figure 1:
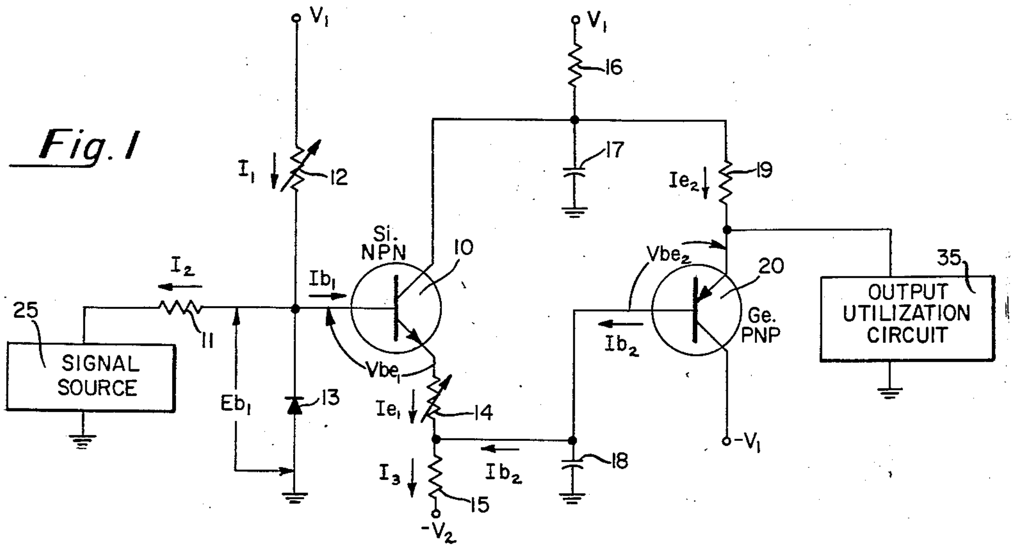
Fig. 1 is a schematic circuit diagram of an exemplary embodiment of the invention.

In consideration of Fig. 1, transistor 10 is a silicon NPN junction transistor, and transistor 20 is a germanium PNP junction transistor. Signals are supplied to the base of transistor 10 from a high impedance source 25, which impedance is represented by resistor 11. Diode 13 prevents the input signal level from going more than a few tenths of a volt negative, i.e., more negative than the voltage drop thereacross. Variable resistor 12 serves as a balance control to provide substantially zero voltage offset between the signal input voltage and the output voltage. The emitter of transistor 10 is connected in series with variable resistor 14, resistor 15, and the negative supply $-V_2$. The collector current of transistor 10 and the emitter current of transistor 20 is provided by supply $V_1$ which is decoupled from the transistors by series resistor 16 and shunt capacitor 17. The base of transistor 20 is connected to the junction of resistors 14 and 15 in the emitter circuit of transistor 10. A capacitor 18 is connected from the base of transistor 20 to ground in order to insure the low output impedance of the amplifier circuit at high frequencies of operation. The output signal appears on the emitter of transistor 20 and is coupled to a utilization circuit 35.

Before proceeding with a detailed description of the manner in which thermal drift is minimized by the present circuit configuration, it will be helpful to review in greater detail the effects of temperature on transistor parameters which must be considered when designing a direct-coupled amplifier.

The collector cutoff current, I*co*, is an exponential function of temperature which doubles every 8 to 10 degrees centigrade in the temperature range of 10° C. to 50° C. At any specified temperature I*co* is one hundred to one thousand times larger in germanium transistors than in silicon transistors.

The transistors of the circuit embodiment depicted in Fig. 1 are the silicon 2N479 for transistor 10, and the germanium 2N247 for transistor 20. The change in the base-to-emitter junction voltage is approximately −1.8 millivolts per degree centigrade for the germanium 2N247, and about 2.4 millivolts per degree centigrade for the 2N479 silicon.

The change in direct current gain, B, over a specified temperature range appears to be a function of the initial B. Increases in B on the order of 50% of the initial value for a temperature increase of from 25° C. to 55° C. have been observed for some transistors.

Figure 2:
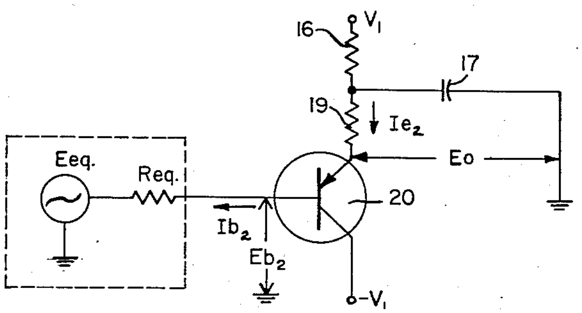
Fig. 2 is an equivalent circuit diagram of the amplifier stages presented to facilitate an analysis of the mode of thermal drift compensation.

Referring to Figs. 1 and 2, it will be assumed that the voltage offset through the amplifier is to be zero, i.e., with the signal input from source 25 equal to zero, the output voltage, $E_0$, on the emitter of transistor 20 will also be zero. In order to accomplish this, the variable impedance 12 is adjusted such that the algebraic sum of the component of voltage $Eb_1$ on the base of transistor 10, the base-to-emitter voltages $Vbe_1$ and $Vbe_2$ of transistors 10 and 20 respectively, and the voltage drop across resistor 14 is zero. This relationship may be expressed:

$$E_0=Eb_1-Vbe_1-(Ie_1R_{14})+Vbe_2 \qquad (1)$$

The currents used in the latter equation will be accurate for only a single temperature, because of changes in B and $Ico$ with variations in temperature. In practice, the value of resistor 12 is made large compared with the value of the source impedance, resistor 11. Accordingly resistor 12 will be considered to have a negligible effect on the value of resistor 11 in the following analysis. The current through resistor 12, as supplied by source $V_1$, is substantially constant throughout the circuit operation.

The thermal drift of the silicon stage, transistor 10, will be determined in the following manner. The base current $Ib_1$ of transistor 10 is a function of the current gain of transistor 10, designated $B_1$, the current through resistor 14 designated $Ie_1$ and the collector leakage current of transistor 10, $Ico_1$. Thus, $$Ib_1=\left(\frac{1}{B_1+1}\right)Ie_1-Ico_1 \qquad (2)$$

Although the latter term of the equation is extremely small for silicon transistors and is often neglected, it has been included in the following analysis. It should be noted that resistor 15 in the emitter circuit of transistor 10 is considerably larger than resistor 14. Current $I_3$, which is the algebraic sum of the emitter current of transistor 10, $Ie_1$, and the base current of transistor 20, $Ib_2$, which includes the collector cutoff current of transistor 20, is substantially constant.

As the temperature increases, $B_1$ and $Ico_1$ increase as previously noted. Also the collector cutoff current of transistor 20, $Ico_2$, increases with temperature. Since this latter current change causes a decrease in $Ib_2$, current $Ie_1$ must increase proportionately to keep current $I_3$ constant. In like manner changes in $B_1$ and $Ico_1$ will cause a decrease in the flow of current $Ib_1$ as the temperature rises, with the result that more of current $I_1$ will be diverted through resistor 11, the series impedance of source 25.

Compensation for drift necessitates the determination of the change in $Eb_1$, which results from a change in $Ib_1$ over the design temperature range. First, the value of $Ib_1$ is computed for each of the two temperature limits of the design range by substituting in Equation 2 the values of $B_1$, $Ie_1$ and $Ico_1$ corresponding respectively to the temperature limits. For example, if the amplifier is to be operated over a thirty degree temperature range, from 25° C. to 55° C., the values of $Ib_1$ are computed for each of the latter temperature limits. The difference of the two computed values is designated $\Delta Ib_1$. The change in $Eb_1$, or $\Delta Eb_1$, resulting from a change in $Ib_1$, is equal to the voltage drop produced by $\Delta Ib_1$ flowing through resistor 11. This relationship may be expressed:

$$\Delta Eb_1=(\Delta Ib_1)(R_{11}) \qquad (3)$$

In addition, as mentioned previously, there is another voltage change in transistor 10 resulting from the change in the base-to-emitter junction voltage, $Vbe_1$, over the design temperature range. This latter change may be designated $\Delta Vbe_1$. The total thermal drift of the first stage, $D_{10}$, is equal to the sum of $\Delta Eb_1$ and $\Delta Vbe_1$, for the design temperature range, thus, $$D_{10}=\Delta Eb_1+\Delta Vbe_1 \qquad (4)$$

Referring to Fig. 2, the thermal drift of the second germanium stage may be computed in the same manner as that described for the silicon stage. In Fig. 2 the silicon stage is represented by a voltage generator $Eeq.$, and an effective output impedance $Req.$ It is assumed in the succeeding analysis that the generator provides only a direct current component of voltage and that this voltage is of the proper amplitude to make the output voltage, $E_0$, equal to zero for the temperature at the lower limit of the design temperature range. It should be understood that at the upper limit of the temperature range, $Eeq.$ will increase positively by an amount equal to $D_{10}$, the thermal drift of the silicon stage.

The drift voltage expressions for the germanium stage due to changes in $B_2$ and $Ico_2$, the D.-C. current gain and the collector cutoff current respectively of transistor 20, can be written in the same form as Equations 2 and 3, that is:

$$Ib_2=\left(\frac{1}{B_2+1}\right)Ie_2-Ico_2 \qquad (5)$$

and $$\Delta Eb_2=(\Delta Ib_2)(Req.) \qquad (6)$$

$Ie_2$ is substantially a constant current so that the change in $Ib_2$ depends only on $B_2$ and $Ico_2$. As in the analysis of the first stage, the value of $Ib_2$ is computed for each of the temperatures at the extremes of the temperature range. The difference in the two values is $\Delta b_2$, which value is substituted in Equation 6.

The absolute value of the total drift term for the second stage $D_{20}$ is:

$$D_{20}=\Delta Eb_2+\Delta Vbe_2 \qquad (7)$$

where the latter term is the change in the base-to-emitter junction voltage of transistor 20 over the design temperature range. Thus in order to make the output voltage $E_0$ equal to zero at the upper limit of the temperature range with no input signal supplied by source 25, i.e., to insure zero thermal drift at the upper temperature limit, the drift term of the first stage $D_{10}$ must be equal to but of opposite polarity from the drift term of the second stage $D_{20}$. This may be expressed:

$$D_{10}=-D_{20} \qquad (8)$$

Substituting from Equations 6 and 7, Equation 8 may be rewritten as:

$$D_{10}=-[(\Delta Ib_2)(Req.)+\Delta Vbe_2] \qquad (9)$$

Equation 9 is solved for $Req.$, the effective output impedance of the silicon transistor stage. This latter impedance consists of two series components, first, the output impedance of transistor 10 which is a function of the signal source impedance (resistor 11) and the D.-C. current gain of the latter transistor; and second, the impedance of resistor 14. Thus for zero thermal drift at the upper limit of temperature, the value of resistor 14 is selected as the difference between $Req.$ and the output impedance of transistor 10.

The graph of Fig. 3 illustrates how the thermal drift of the silicon and germanium stages respectively compensate for thermal drift over an arbitrarily selected temperature range of from 25° C. to 55° C. It will be noted that in accordance with the design procedure described hereinbefore that the drift $D_{10}$ is a nearly linear function of temperature with a slight curvature downward due to the hyperbolic form of drift due to variations in $B_1$. The drift of the second stage $D_{20}$ is a combination of a nearly linear $Vbe_2$ variation, a hyperbolic variation due to changes in $B_2$ and an exponential drift caused by $Ico_2$ variations. The resultant drift of the compensated amplifier is designated $Dr$. Because of the exponential form of $Ico_2$ the absolute value of $D_{20}$ will be less than that of $D_{10}$ between 25° C. and 55° C., and will be larger than $D_{10}$ above 55° C.

While it will be understood that the circuit specfications for the basic buffer amplifier shown may vary according to the design or application, the following circuit parameters are included by way of example:

Supply voltages:
- $V_1$ ------- 15 volts.
- $V_1$ ------- −6 volts.
- $-V_2$ ----- −15 volts.

Transistors:
- 10 ------ Silicon NPN—2N479.
- 20 ------- Germanium PNP—2N247.

Diode: 13 ---- Silicon IN475.

Resistors:
- 11 ------- 20,000 ohms (impedance of source 25).
- 12 ------ 500,000 ohms (nominal).
- 14 ------- 500 ohms (nominal).
- 15 ------- 61,900 ohms.
- 16 ------- 100 ohms.
- 19 ------ 5,100 ohms.

Capacitors:
- 17 ------- 15 mfd. Tantalum electrolytic shunted by .01 mfd. ceramic disc capacitor for high frequency bypassing.
- 18 ------ 56 mmfd.

It should be noted that the circuit as described is adapted to pass only positive polarity signals. By removing diode 13 and adjusting the operating points of transistors 10 and 20 in accordance with design procedures well-known in the art, the instant buffer amplifier can be made to pass bipolar signals.

The following performance data is exemplary for the embodiment of the invention depicted in Fig. 1, namely, the amplifier circuit gain is 0.95; the input impedance, approximately 400,000 ohms; the output impedance, 30 ohms; the frequency band, zero cycles per second to two megacycles.

The output impedance of the amplifier is a function of the equivalent output impedance of the silicon transistor stage and the current gain of the germanium stage. At higher frequencies, on the order of one megacycle, the value of $Req.$ increases due to a drop in the value $B_1$, the current gain of transistor 10. This effect is counteracted by the decrease in reactance of capacitor 18 as the frequency increases. The total effect is an output impedance which is nearly constant up to one megacycle.

From the foregoing analysis it is evident that satisfactory temperature compensation has been achieved for a cascaded direct-coupled transistor amplifier. The present technique of temperature compensation utilizes the adjustment of the effective output impedance of the input amplifier stage, and the arrangement of the output stage in such a manner that the collector cutoff current thereof flows through said output impedance and develops a compensating voltage thereacross. The compensating voltage is of the proper amplitude and polarity to bias the output stage so as to compensate to a large extent for the temperature variations in the base-to-emitter junction voltages of both amplifier stages. This compensating effect is in addition to the compensation afforded by the complementary symmetry configuration, which latter compensation is inadequate for many applications.

It should be noted that although the input and output amplifier stages have been described herein as incorporating respectively a silicon NPN and a germanium PNP transistor, the use of opposite conductivity types of silicon and germanium transistors may also be employed as the respective input and output stages. This latter arrangement may be made in accordance with established design procedures well known to those skilled in the art. It is important, however, to note that the input stage should preferably exhibit a larger rate of change of base-to-emitter junction voltage for a given increment of temperature change as compared with a similar interelectrode voltage change for the output stage. Further, the collector cutoff current of the output stage should be larger than that of the input stage. Obviously if the signal source impedance is high, the collector cutoff current of the input stage should be as small as possible to minimize thermal drift. These conditions are inherently met by the use of a silicon transistor in the input stage and a germanium transistor in the output stage. Thus if the instant amplifier were to be constructed using two germanium transistors, the input stage would be unsatisfactory due to the relatively high collector cutoff current which would flow through the impedance of the signal source. On the other hand, the use of silicon transistors in both stages is not satisfactory for the following reasons. Silicon transistors having the same type number exhibit substantial differances in the base-to-emitter junction voltage variations with temperature. The present technique of adjusting the effective output impedance of the input stage would be ineffective since the collector cutoff current of the output stage and the compensating voltage produced thereby is relatively small as compared with germanium. Also the over-all drift of the output stage may already be larger than the drift of the input stage, thereby precluding the method of drift compensation herein described. In addition, at the present time, the use of a silicon transistor in an application where a germanium transistor is satisfactory cannot be recommended for economic reasons.

Since other modifications of the amplifier varied to fit particular operating requirements will be apparent to those skilled in the art, the invention is not considered limited to the embodiment chosen for purposes of disclosure, and covers all changes and modifications which do not constitute departures from the true scope of this invention. Accordingly, all such variations as are in accord with the principles discussed previously are meant to follow within the scope of the appended claims.

What is claimed is:

1. A semiconductor amplifier comprising in combination a plurality of transistors, each of said transistors having an emitter, a base and a collector electrode, each of said transistors having a base-to-emitter voltage drop which varies as a function of the ambient temperature, a first of said transistors having a negligible collector cutoff current, a second of said transistors having an appreciably larger collector cutoff current than said first transistor, the change in said base-to-emitter voltage drop of said first transistor being substantially larger than the corresponding change in the base-to-emitter voltage drop of said second transistor for a specified incremental change in said ambient temperature, said first and second transistors being of opposite conductivity types, the base electrode of said first transistor being adapted to receive input signals from a source thereof, impedance means connected to the emitter of said first transistor, the base of said second transistor being connected to said impedance means, the input signals amplified by said first transistor appearing across said impedance means, said collector cutoff current of said second transistor flowing through said impedance means and producing a voltage drop thereacross, means for deriving an output signal from the emitter electrode of said second transistor, said latter output signal being substantially independent of the temperature variations of said transistors due to the compensation of the thermal drift voltages resulting from the algebraic addition of the thermal voltages appearing respectively across the base-to-emitter electrodes of said first and second transistors and the voltage drop across said impedance means furnished by the collector cutoff current of said second transistor.

2. A buffer amplifier comprising in combination a silicon transistor and a germanium transistor, each of said transistors having an emitter, a base and a collector electrode, said transistors being direct-coupled in complementary symmetry fashion, the base-to-emitter junction voltage and the collector cutoff current of each of said transistors being a function of temperature and the semiconductor material of which the transistor is formed, the base electrode of said silicon transistor being adapted to receive the input signals to be amplified, the signals amplified by said silicon transistor appearing across the effective output impedance of the latter transistor, means for varying the effective output impedance of said silicon transistor, circuit means coupling the output signal of said silicon transistor to the base electrode of said germanium transistor, the collector cutoff current of said germanium transistor flowing through the effective output impedance of said silicon transistor, means for deriving output signal voltages from the emitter of said germanium transistor, said latter output voltages being substantially independent of changes in the ambient temperature of said transistors due to the compensation of the thermal drift voltages resulting from the algebraic addition of the voltages appearing respectively across the base-to-emitter electrodes of said silicon and germanium transistors and the voltage drop across said effective output impedance of said silicon transistor produced by collector cutoff current of said germanium transistor.

3. A cascaded semiconductor amplifier comprising in combination a pair of junction transistors, said transistors being connected as direct-coupled emitter follower stages arranged in complementary symmetry, each of said transistors having an emitter, a base and a collector electrode, the base-to-emitter junction voltage of each of said transistors being a function of the ambient temperature, a first of said transistors having a negligible cutoff current, the second of said transistors having a substantial collector cutoff current, the change in said base-to-emitter junction voltage of said first transistor being substantially larger than the corresponding change in the base-to-emitter junction voltage of said second transistor for a specified incremental change in the ambient temperature, the base electrode of said first transistor being adapted to receive input signals from a source thereof, a variable impedance element connected to the emitter electrode of said first transistor, the value of said impedance element determining the effective output impedance of said first transistor, the base electrode of said second transistor being connected to said impedance element, the collector cutoff current of said second transistor flowing through said impedance element and producing a voltage drop thereacross, said latter voltage being of the proper amplitude and polarity to bias said second transistor so as to compensate for residual variations in said base-to-emitter junction voltages which are present in the amplifier notwithstanding the cancellation of such variations provided by the complementary symmetry configuration, and means for deriving output signals from the emitter of said second transistor, said output signals being substantially unaffected by the thermal variations in said transistors.

4. A cascaded semiconductor amplifier comprising in combination a silicon NPN junction transistor and a germanium PNP junction transistor, said transistors being connected as direct-coupled emitter follower stages arranged in a complementary symmetry configuration, each of said transistors having an emitter, a base and a collector electrode, the thermal variations in the electrical characteristics of each of said transistors being a function of the semiconductor material of which each is formed, the base of said silicon transistor being adapted to receive input signals from a high impedance source, a variable impedance element connected to the emitter electrode of said silicon transistor, the value of said impedance element determining the effective output impedance of said silicon transistor, the amplified signal of said silicon transistor appearing across said impedance element, the base electrode of said germanium transistor being connected to said impedance element, the collector cutoff current of said germanium transistor flowing through said impedance element and producing a voltage drop thereacross, said latter voltage drop being of the proper amplitude and polarity to bias said germanium transistor in a manner to compensate for the larger thermal rate of change of the base-to-emitter junction voltage of the silicon transistor as compared with the germanium transistor, the amplifier output voltage appearing on the emitter electrode of said germanium transistor being substantially unaffected by the thermal variations in both of said transistors.

5. A cascaded direct-coupled amplifier comprising in combination a silicon NPN transistor and a germanium PNP transistor, each of said transistors having an emitter, a base and a collector electrode, the base of said silicon transistor being adapted to receive input signals from a high impedance source, variable impedance means connected to the base of said silicon transistor and to said high impedance source, said variable impedance means being adapted to supply a bias potential to the base of said silicon transistor, said bias potential being of the proper amplitude and polarity to cancel the offset voltage which would otherwise exist as a component of the amplified input signals because of the inherent difference in the interelectrode voltage drops of the respective transistors, a variable resistor having at least one tap terminal, said resistor being connected to the emitter electrode of said silicon transistor, the adjustment of said tap on said variable resistor varying the effective output impedance of said silicon transistor, the base electrode of said germanium transistor being connected to said tap terminal, an impedance element coupled to the emitter of said germanium transistor, said amplified input signals appearing across said impedance element, and circuit means coupled to the emitter electrode of said germanium transistor for utilizing said amplified signals.

6. A cascaded semiconductor amplifier comprising in combination a silicon NPN junction transistor and a germanium PNP junction transistor, said transistors being connected as direct-coupled emitter follower stages arranged in a complementary symmetry configuration, the thermal variations in the electrical characteristics of each of said transistors being a function of the semiconductor material of which each is formed, the base of said silicon transistor being adapted to receive input signals from a high impedance source, variable impedance means coupled to the base of said silicon transistor and adapted to supply a bias potential to the base of said latter transistor, said bias potential being of the proper amplitude and polarity to cancel the offset voltage which would otherwise exist as a component of the amplified input signals due to the inherent difference in the interelectrode voltage drops of the respective transistors, a variable resistor having at least one tap terminal, said resistor being connected to the emitter electrode of said silicon transistor, the adjustment of said tap on said variable resistor determining the effective output impedance of said silicon transistor, the base electrode of said germanium transistor being connected to said tap terminal, the collector cutoff current of said germanium transistor flowing through said variable resistor and producing a voltage drop thereacross, said latter voltage drop being of the proper amplitude and polarity to bias said germanium transistor in a manner to compensate for the larger thermal rate of change of the base-to-emitter junction voltage of the silicon transistor as compared with the germanium transistor, said amplified input signals appearing on the emitter electrode of said germanium transistor being substantially unaffected by the thermal variations in both of said transistors, and circuit means coupled to the emitter electrode of said germanium transistor for utilizing said amplified signals.

7. A semiconductor amplifier as defined in claim 6 wherein said germanium junction transistor is a drift transistor having a resistivity gradient in the base region between the junctions thereof, said drift transistor having a high cutoff frequency and being adapted for high speed operation.

8. A semiconductor amplifier as defined in claim 6 including a capacitive element having a pair of terminals, one of said terminals being connected to the base electrode of said germanium transistor, the other of said terminals being connected to a source of reference potential, the decrease in the reactance of said capacitive element at high frequencies tending to compensate for increases in the effective output impedance of said silicon transistor at said higher frequencies, thereby insuring a low and relatively constant amplifier output impedance.

References Cited in the file of this patent

UNITED STATES PATENTS

| | | |
|---|---|---|
| 2,859,405 | Feldman et al. | Nov. 4, 1958 |
| 2,881,269 | Hanel et al. | Apr. 7, 1959 |